United States Patent
Ogura et al.

(10) Patent No.: US 11,444,551 B2
(45) Date of Patent: Sep. 13, 2022

(54) POWER CONVERSION DEVICE WITH INVERTER CIRCUIT

(71) Applicant: HITACHI AUTOMOTIVE SYSTEMS, LTD., Hitachinaka (JP)

(72) Inventors: Takashi Ogura, Hitachinaka (JP); Ryuji Kurihara, Hitachinaka (JP); Ryoichi Inada, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 16/966,975

(22) PCT Filed: Dec. 26, 2018

(86) PCT No.: PCT/JP2018/047723
§ 371 (c)(1),
(2) Date: Aug. 3, 2020

(87) PCT Pub. No.: WO2019/155776
PCT Pub. Date: Aug. 15, 2019

(65) Prior Publication Data
US 2021/0050799 A1 Feb. 18, 2021

(30) Foreign Application Priority Data
Feb. 6, 2018 (JP) .............................. JP2018-019398

(51) Int. Cl.
*H02M 7/5387* (2007.01)
*G01R 19/165* (2006.01)
(Continued)

(52) U.S. Cl.
CPC .. *H02M 7/53871* (2013.01); *G01R 19/16538* (2013.01); *H02H 5/04* (2013.01);
(Continued)

(58) Field of Classification Search
CPC .. G01R 19/16538; H02H 5/04; H02H 7/1225; H02J 9/062; H02M 1/0006;
(Continued)

(56) References Cited

U.S. PATENT DOCUMENTS

| 2012/0235488 A1* | 9/2012 | Hamanaka | H02M 1/32 |
| | | | 307/64 |
| 2014/0092655 A1* | 4/2014 | Igarashi | H02H 7/122 |
| | | | 363/56.03 |

(Continued)

FOREIGN PATENT DOCUMENTS

| JP | 2011-239608 A | 11/2011 |
| JP | 2011-244625 A | 12/2011 |

(Continued)

OTHER PUBLICATIONS

International Search Report with English translation and Written Opinion issued in corresponding application No. PCT/JP2018/047723 dated Apr. 9, 2019.

*Primary Examiner* — Yemane Mehari
(74) *Attorney, Agent, or Firm* — Foley & Lardner LLP

(57) ABSTRACT

An object of the present invention is to improve availability when a power is lost. In a power conversion device 1, a gate drive power supply circuit 50 can supply a gate drive power within a predetermined normal voltage range. A backup power supply circuit 70 supplies the gate drive power to a lower arm gate circuit 40 when a voltage of the gate drive power applied from the gate drive power supply circuit 50 to the lower arm gate circuit 40 falls below a normal voltage range. When the gate drive power is supplied from the backup power supply circuit 70, the lower arm gate circuit 40 drives a lower arm switching circuit 22 in a short state in which all switching elements of the lower arm switching circuit 22 are turned on.

10 Claims, 9 Drawing Sheets

(51) Int. Cl.
*H02H 5/04* (2006.01)
*H02H 7/122* (2006.01)
*H02J 9/06* (2006.01)
*H02M 1/08* (2006.01)
*H02M 1/32* (2007.01)
*H02P 27/06* (2006.01)
*H02M 1/00* (2006.01)

(52) U.S. Cl.
CPC ........... *H02H 7/1225* (2013.01); *H02J 9/062* (2013.01); *H02M 1/08* (2013.01); *H02M 1/32* (2013.01); *H02P 27/06* (2013.01); *H02M 1/0006* (2021.05); *H02M 1/325* (2021.05); *H02M 1/327* (2021.05)

(58) Field of Classification Search
CPC .......... H02M 1/08; H02M 1/32; H02M 1/325; H02M 1/327; H02M 7/53871; H02P 27/06

USPC .......................................................... 323/56
See application file for complete search history.

(56) References Cited

U.S. PATENT DOCUMENTS

2017/0331400 A1* 11/2017 Saha .................... H02P 6/12
2021/0050799 A1* 2/2021 Ogura .................... H02J 9/062

FOREIGN PATENT DOCUMENTS

| JP | 2014-158399 A | 8/2014 |
| JP | 2014-217131 A | 11/2014 |
| JP | 2015-159684 A | 9/2015 |
| JP | 2017-118815 A | 6/2017 |
| WO | WO-2016/104318 A1 | 6/2016 |

* cited by examiner

POWER CONVERSION DEVICE WITH INVERTER CIRCUIT

TECHNICAL FIELD

The present invention relates to a power conversion device.

BACKGROUND ART

A technology described in PTL 1 is known as a background art of the present invention. PTL 1 discloses a rotary electric machine control device that controls to drive an AC rotary electric machine, and includes an inverter which is interposed between a high-voltage DC power supply and the rotary electric machine, and performs power conversion between DC and AC, an inverter control device which operates by a power supplied from a low-voltage DC power supply which is a power supply having a voltage lower than that of the high-voltage DC power supply and is insulated from the high-voltage DC power supply and controls to switch between switching elements of the inverter, a backup power supply which has the high-voltage DC power supply as a power source and is capable of supplying a power to the inverter control device, and a power supply switching switch which switches a power supply path so as to supply a power to the inverter control device from the backup power supply in a low-voltage power supply reduced state in which the power supplied from the low-voltage DC power supply to the inverter control device is equal to or less than a predetermined reference value.

CITATION LIST

Patent Literature

PTL 1: JP 2015-159684 A

SUMMARY OF INVENTION

Technical Problem

In the technology described in PTL 1, the power supply path is switched by detecting a decrease in the power of the low-voltage DC power supply supplied to the inverter control device, and the power is supplied from the backup power supply using the high-voltage DC power supply to the inverter control device. Therefore, it is not possible to cope with a decrease in the power supply voltage supplied from the gate drive power supply to the gate drive circuit, and thus, there is room for improvement in availability when the power is lost.

Solution to Problem

A power conversion device according to the present invention includes an inverter circuit unit that includes an upper arm switching circuit and a lower arm switching circuit each having a plurality of switching elements, an upper arm gate circuit that outputs a gate signal to the upper arm switching circuit, a lower arm gate circuit that outputs a gate signal to the lower arm switching circuit, a gate drive power supply circuit that supplies powers to the upper arm gate circuit and the lower arm gate circuit, and a backup power supply circuit that supplies the power to at least one of the upper arm gate circuit and the lower arm gate circuit instead of the gate drive power supply circuit. The gate drive power supply circuit is capable of supplying the power within a predetermined normal voltage range, the backup power supply circuit supplies the power to at least one of the upper arm gate circuit and the lower arm gate circuit when a voltage of the power applied to at least one of the upper arm gate circuit and the lower arm gate circuit from the gate drive power supply circuit falls below the normal voltage range, and at least one of the upper arm gate circuit and the lower arm gate circuit drives each of the upper arm switching circuit and the lower arm switching circuit by causing one switching circuit of the upper arm switching circuit or the lower arm switching circuit to be in a short-circuited state in which all the switching elements are turned on and causing the other switching circuit to be in an opened state in which all the switching elements are turned off when the power is supplied from the backup power supply circuit.

Advantageous Effects of Invention

According to the present invention, availability when a power is lost can be improved.

DESCRIPTION OF EMBODIMENTS

Figure 1:
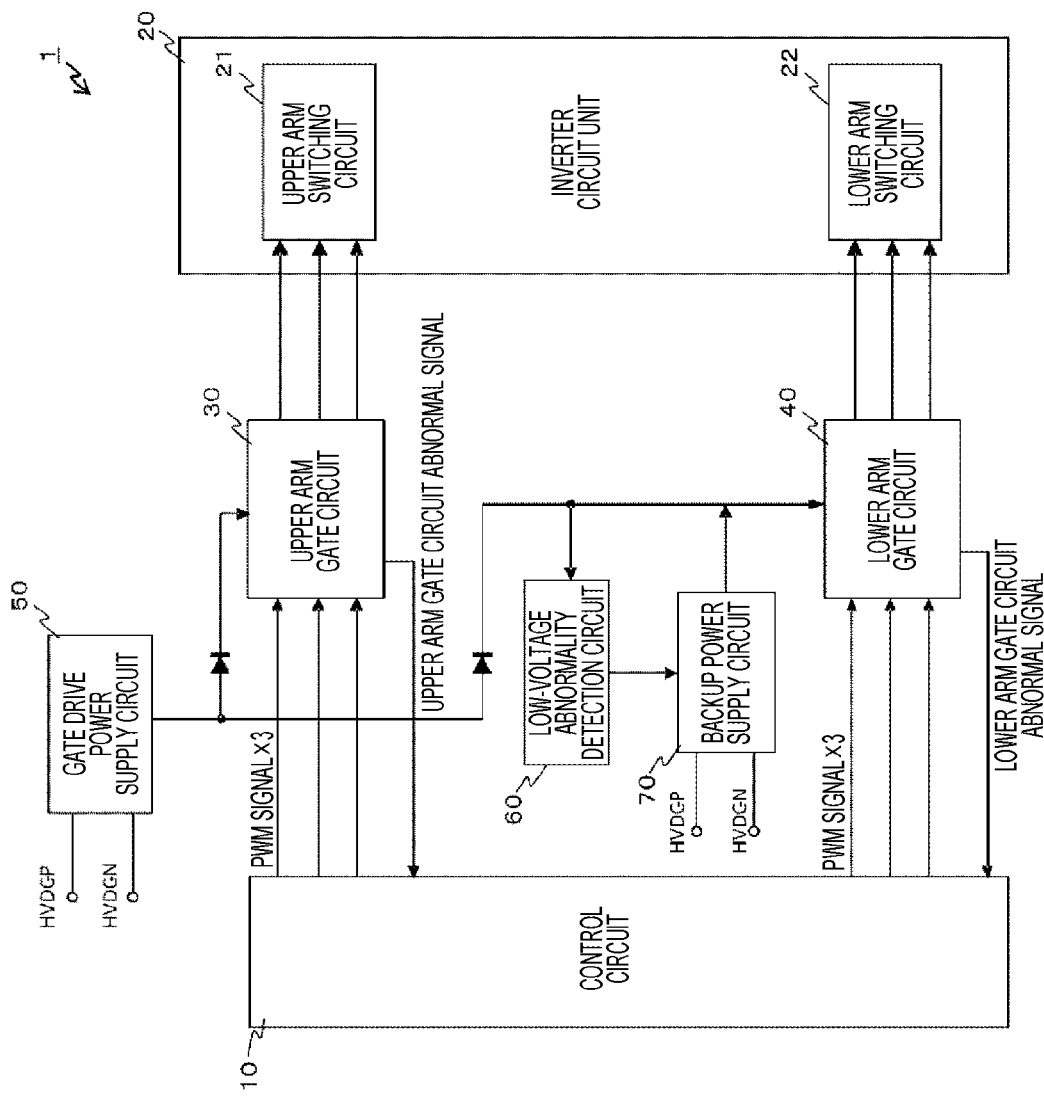
FIG. 1 is a diagram illustrating a configuration of a power conversion device according to an embodiment of the present invention.

FIG. 1 is a diagram illustrating a configuration of a power conversion device according to an embodiment of the present invention.

The power conversion device 1 illustrated in FIG. 1 is, for example, mounted on a vehicle to drive a traveling motor of the vehicle, and includes a control circuit 10, an inverter circuit unit 20, an upper arm gate circuit 30, a lower arm gate circuit 40, a gate drive power supply circuit 50, a low-voltage abnormality detection circuit 60, and a backup power supply circuit 70.

The inverter circuit unit 20 converts a DC power supplied from a high-voltage battery (not illustrated) into an AC power, and outputs the AC power to a motor, and includes an upper arm switching circuit 21 and a lower arm switching circuit 22. The upper arm switching circuit 21 and the lower arm switching circuit 22 each have a plurality of switching elements corresponding to the number of phases of the motor. For example, when the motor is a three-phase AC motor, the upper arm switching circuit 21 and the lower arm switching circuit 22 each have three switching elements. Each switching element is constituted by using, for example, an insulated gate bipolar transistor (IGBT) or a metal-oxide-semiconductor field effect transistor (MOSFET).

The control circuit 10 generates PWM signals corresponding to the number of phases of the motor based on an operation command value of the motor input from an upper controller (not illustrated), and outputs the generated PWM signals to the upper arm gate circuit 30 and the lower arm gate circuit 40. For example, when the motor is a three-phase AC motor, the control circuit 10 generates and outputs three PWM signals to the upper arm gate circuit 30 and the lower arm gate circuit 40, respectively.

The upper arm gate circuit 30 and the lower arm gate circuit 40 generate gate signals based on the PWM signals input from the control circuit 10, and output the generated gate signals to the upper arm switching circuit 21 and the lower arm switching circuit 22, respectively. The upper arm switching circuit 21 drives to switch the plurality of switching elements in response to the gate signals from the upper arm gate circuit 30. Similarly, the lower arm switching circuit 22 drives to switch the plurality of switching elements in response to the gate signals from the lower arm gate circuit 40.

Accordingly, the DC power is converted into the AC power, and is supplied to the motor.

The gate drive power supply circuit 50 generates powers (hereinafter, referred to as "gate drive powers") for operating the upper arm gate circuit 30 and the lower arm gate circuit 40, and supplies the powers to the gate circuits. Although FIG. 1 illustrates an example in which the gate drive power supply circuit 50 generates the gate drive powers by using the DC power supplied from the high-voltage battery for driving the motor, the gate drive power supply circuit 50 may generate the gate drive powers by using a DC power supplied from a low-voltage battery used as an operation power supply of the control circuit 10.

When the voltage of the gate drive power applied from the gate drive power supply circuit 50 to the lower arm gate circuit 40 falls below a predetermined voltage range, the low-voltage abnormality detection circuit 60 detects this voltage drop as a low-voltage abnormality, and operates the backup power supply circuit 70. Hereinafter, the voltage range of the gate drive power in which the low-voltage abnormality detection circuit 60 detects the low-voltage abnormality is referred to as a "low-voltage abnormality detection voltage range". The details of the low-voltage abnormality detection voltage range will be described below with reference to FIG. 2.

When the voltage of the gate drive power applied from the gate drive power supply circuit 50 to the lower arm gate circuit 40 is blew the voltage range (hereinafter, referred to as a "normal voltage range") of the gate drive power capable of being supplied by the gate drive power supply circuit 50 during a normal operation, the backup power supply circuit 70 supplies a backup gate drive power to the lower arm gate circuit 40 instead of the gate drive power supply circuit 50. Specifically, when the voltage of the gate drive power applied from the gate drive power supply circuit 50 to the lower arm gate circuit 40 falls below the normal voltage range and reaches the aforementioned low-voltage abnormality detection voltage range, the backup power supply circuit 70 is activated by the low-voltage abnormality detection circuit 60, and the supply of the gate drive power from the backup power supply circuit 70 to the lower arm gate circuit 40 is started. Similarly to the gate drive power supply circuit 50, although FIG. 1 illustrates an example in which the backup power supply circuit 70 generates the backup gate drive power by using the DC power supplied from the high-voltage battery for driving the motor, the gate drive power may be generated by using the DC power supplied from the low-voltage battery used as the operation power supply of the control circuit 10.

When the upper arm gate circuit 30 detects that an operation state of the upper arm gate circuit itself or the upper arm switching circuit 21 is abnormal, the upper arm gate circuit outputs an upper arm gate circuit abnormal signal to the control circuit 10. For example, when the voltage of the gate drive power supplied from the gate drive power supply circuit 50 is lower than a predetermined operation stop voltage required for generating the gate signal, or when a current flowing through the upper arm switching circuit 21 is in a predetermined overcurrent state, the upper arm gate circuit 30 outputs the upper arm gate circuit abnormal signal. Similarly, when the lower arm gate circuit 40 detects that an operation state of the lower arm gate circuit itself or the lower arm switching circuit 22 is abnormal, the lower arm gate circuit outputs a lower arm gate circuit abnormal signal to the control circuit 10.

When the upper arm gate circuit abnormal signal is input from the upper arm gate circuit 30 or the lower arm gate circuit abnormal signal is input from the lower arm gate circuit 40, the control circuit 10 generates PWM signals for safely stopping the motor, and outputs the generated PWM signals to the upper arm gate circuit 30 and the lower arm gate circuit 40. For example, the PWM signals for turning off all the switching elements to cause the switching circuit to be in an opened state are output to one gate circuit of the upper arm gate circuit 30 and the lower arm gate circuit 40 which outputs the abnormal signal, and the PWM signals for turning on all the switching elements to cause the switching circuit to be in a short-circuited state are output to the other gate circuit thereof. Thus, when an abnormality occurs in the upper arm gate circuit 30, the lower arm gate circuit 40, the upper arm switching circuit 21, or the lower arm switching circuit 22, it is possible to shift the vehicle to a safe state by safely stopping the motor.

Figure 2:
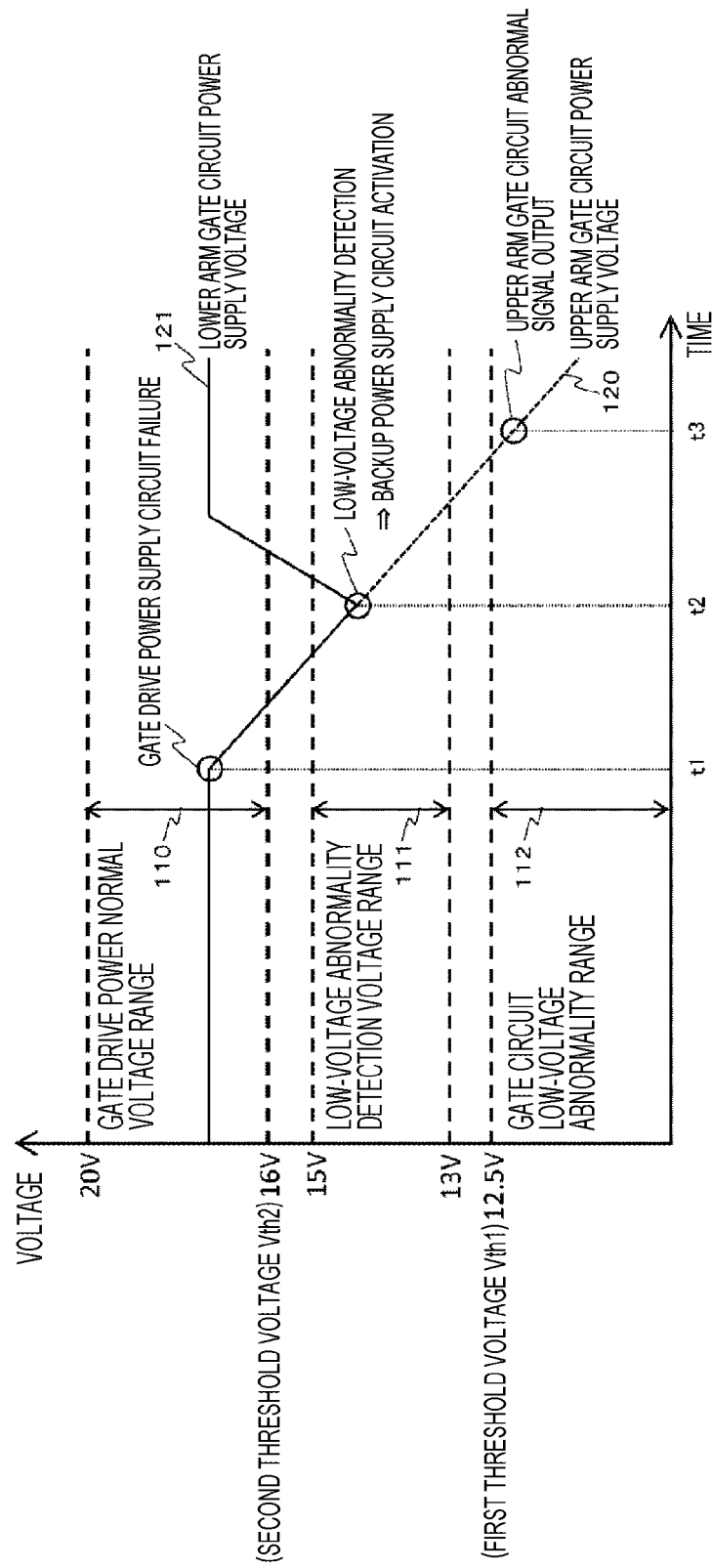
FIG. 2 is an explanatory diagram of an operation of the power conversion device when a failure occurs in a gate drive power supply circuit.

Next, an operation of the power conversion device 1 when a failure occurs in the gate drive power supply circuit 50 will be described with reference to FIG. 2. In FIG. 2, a voltage range indicated by a reference sign 110 indicates the voltage range of the gate drive power capable of being supplied by the gate drive power supply circuit 50 during the normal operation, that is, the aforementioned normal voltage range. This normal voltage range 110 is, for example, 16 V to 20 V. A voltage range indicated by a reference sign 112 indicates a voltage range of the gate drive power in a low-voltage abnormal state in which the upper arm gate circuit 30 and the lower arm gate circuit 40 cannot normally operate, that is, a voltage range lower than the aforementioned operation stop voltage. This voltage range 112 is, for example, less than 12.5 V. In contrast to these voltage ranges, a voltage range indicated by a reference sign 111 indicates a low-voltage abnormality detection voltage range in which the low-voltage abnormality detection circuit 60 detects the low-voltage abnormality. The low-voltage abnormality detection voltage range 111 is set between the normal voltage range 110 and the voltage range 112 lower than the operation stop voltage. For example, the low-voltage abnormality detection voltage range 111 is set at 13V to 15V.

In FIG. 2, a broken line 120 and a solid line 121 illustrate examples of changes in voltage of the gate drive powers supplied to the upper arm gate circuit 30 and the lower arm gate circuit 40 when the failure occurs in the gate drive power supply circuit 50. Until time t2, the broken line 120 and the solid line 121 are common.

As illustrated by the broken line 120 and the solid line 121, the failure occurs in the gate drive power supply circuit 50 at time t1, and the voltages of the gate drive powers applied to the upper arm gate circuit 30 and the lower arm gate circuit 40 from the gate drive power supply circuit 50 starts to decrease. In this case, when the voltage of the gate drive power falls below the normal voltage range 110 and falls within the low-voltage abnormality detection voltage range 111, for example, the low-voltage abnormality detection circuit 60 detects the low-voltage abnormality and the backup power supply circuit 70 is activated at time t2. Accordingly, the backup gate drive power is supplied from the backup power supply circuit 70 to the lower arm gate circuit 40 instead of the gate drive power supply circuit 50, and the voltage applied to the lower arm gate circuit 40 rises as indicated by the solid line 121. When the voltage applied to the lower arm gate circuit 40 falls within a predetermined operation voltage range, the lower arm gate circuit 40 can normally operate even though the gate drive power supply circuit 50 fails.

Meanwhile, when the failure occurs in the gate drive power supply circuit 50, the voltage of the gate drive power applied from the gate drive power supply circuit 50 to the upper arm gate circuit 30 continues to decrease as indicated by the broken line 120. When the voltage applied to the upper arm gate circuit 30 decreases until reaching the voltage range 112, the upper arm gate circuit 30 outputs the upper arm gate circuit abnormal signal to the control circuit 10, for example, at time t3.

When the upper arm gate circuit abnormal signal is input from the upper arm gate circuit 30 at time t3, the control circuit 10 outputs the PWM signals to the upper arm gate circuit 30 so as to turn off all the switching elements of the upper arm switching circuit 21. The upper arm gate circuit 30 that receives the PWM signals turns off all the switching elements of the upper arm switching circuit 21 to cause the upper arm switching circuit to be in the opened state. When the upper arm gate circuit abnormal signal is output, control may be performed such that the upper arm gate circuit 30 turns off all the switching elements of the upper arm switching circuit 21 without waiting for the PWM signals from the control circuit 10. Meanwhile, the control circuit 10 outputs the PWM signals to the lower arm gate circuit 40 so as to turn on all the switching elements of the lower arm switching circuit 22. The lower arm gate circuit 40 that receives the PWM signals turns on all the switching elements of the lower arm switching circuit 22 to causes the lower arm switching circuit to be in the short-circuited state. Thus, even in a state in which a rotation speed of the motor is high, the vehicle can be shifted to the safe state by safely stopping the motor.

Figure 3:
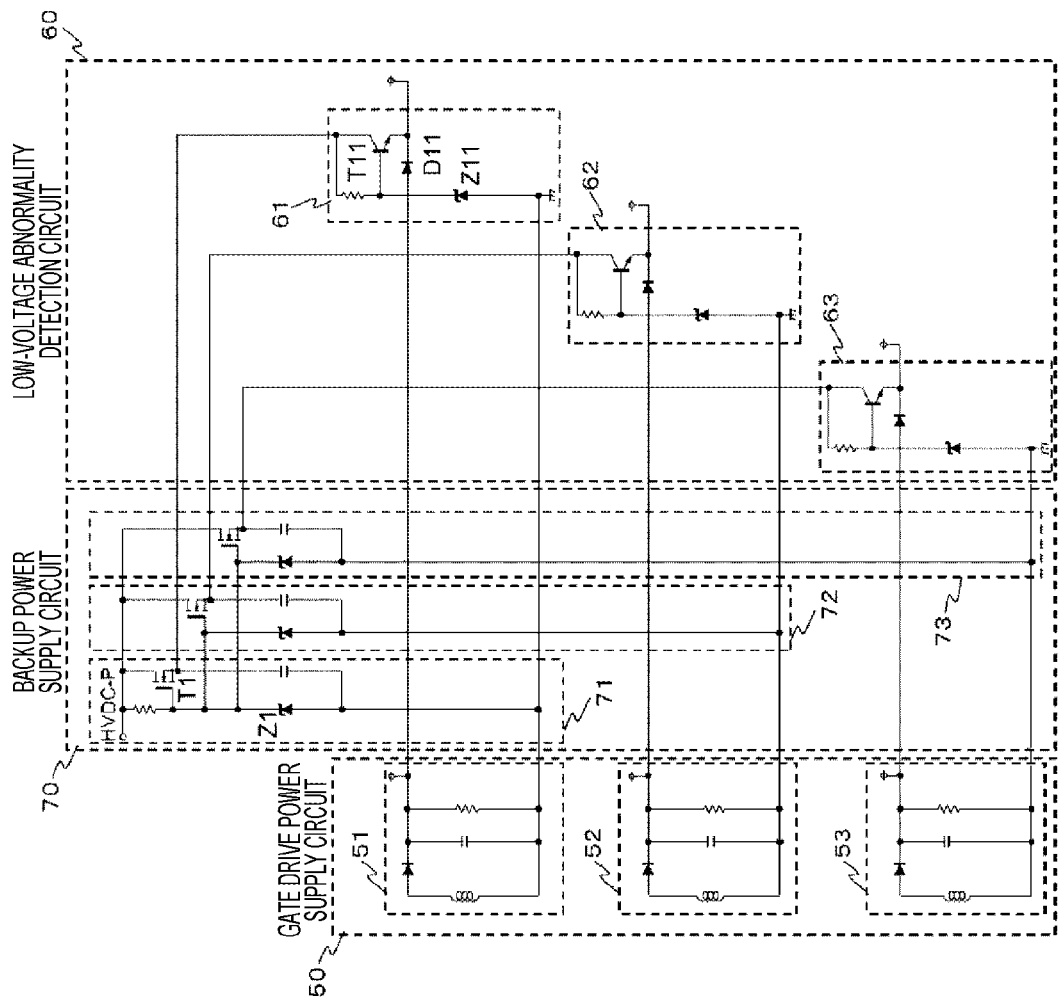
FIG. 3 is a diagram illustrating a circuit configuration example of the gate drive power supply circuit, a low-voltage abnormality detection circuit, and a backup power supply circuit.

Next, specific circuit configuration examples of the gate drive power supply circuit 50, the low-voltage abnormality detection circuit 60, and the backup power supply circuit 70 and operations thereof will be described. FIG. 3 is a diagram illustrating the circuit configuration examples of the gate drive power supply circuit 50, the low-voltage abnormality detection circuit 60, and the backup power supply circuit 70 for the three-phase AC motor. The gate drive power supply circuit 50 includes a U-phase gate drive power supply circuit 51, a V-phase gate drive power supply circuit 52, and a W-phase gate drive power supply circuit 53. The gate drive power supply circuit 50 in FIG. 3 illustrates only a secondary side of a flyback power supply circuit. The low-voltage abnormality detection circuit 60 includes a U-phase low-voltage abnormality detection circuit 61, a V-phase low-voltage abnormality detection circuit 62, and a W-phase low-voltage abnormality detection circuit 63. The backup power supply circuit 70 includes a U-phase backup power supply circuit 71, a V-phase backup power supply circuit 72, and a W-phase backup power supply circuit 73.

In the U-phase low-voltage abnormality detection circuit 61, a Zener voltage Vz of a Zener diode Z11 is set within a range expressed by the following Expression (1). In Expression (1), Vth1 is a minimum value of the voltage of the gate drive power at which the lower arm gate circuit 40 can normally operate, that is, the operation stop voltage of the lower arm gate circuit 40, and corresponds to an upper limit value of the voltage range 112 of FIG. 2. Meanwhile, Vth2 is a minimum value of the output voltage of the gate drive power supply circuit 50, and corresponds to a lower limit value of the normal voltage range 110 of FIG. 2. Vbe represents a base-emitter voltage of a transistor T11, and Vd represents a voltage value of a forward voltage drop of a diode D11. The same applies to the V-phase low-voltage abnormality detection circuit 62 and the W-phase low-voltage abnormality detection circuit 63.

$$Vth1+Vbe<Vz<Vth2-Vd+Vbe \quad (1)$$

When the voltage value of the U-phase gate drive power output from the U-phase gate drive power supply circuit 51 decreases, in the U-phase low-voltage abnormality detection circuit 61, the Zener diode Z11 breaks down, and the transistor T1 is turned on. In the U-phase backup power supply circuit 71, a voltage value obtained by subtracting a gate threshold voltage for turning on a gate of a transistor T1 from the Zener voltage of a Zener diode Z1 is output as a backup U-phase gate drive power. The same applies to the V-phase low-voltage abnormality detection circuit 62 and the V-phase backup power supply circuit 72, and the W-phase low-voltage abnormality detection circuit 63 and the W-phase backup power supply circuit 73.

As described above, in the U-phase low-voltage abnormality detection circuit 61, the validity or invalidity of the backup of the U-phase gate drive power is controlled by the U-phase backup power supply circuit 71 according to on or off state of the transistor T11. Accordingly, a time from the occurrence of the abnormality in the U-phase gate drive power supply circuit 51 to the start of the backup power supply is shortened. The same applies to the V phase and the W phase other than the U phase.

Comparative Example

Figure 4:
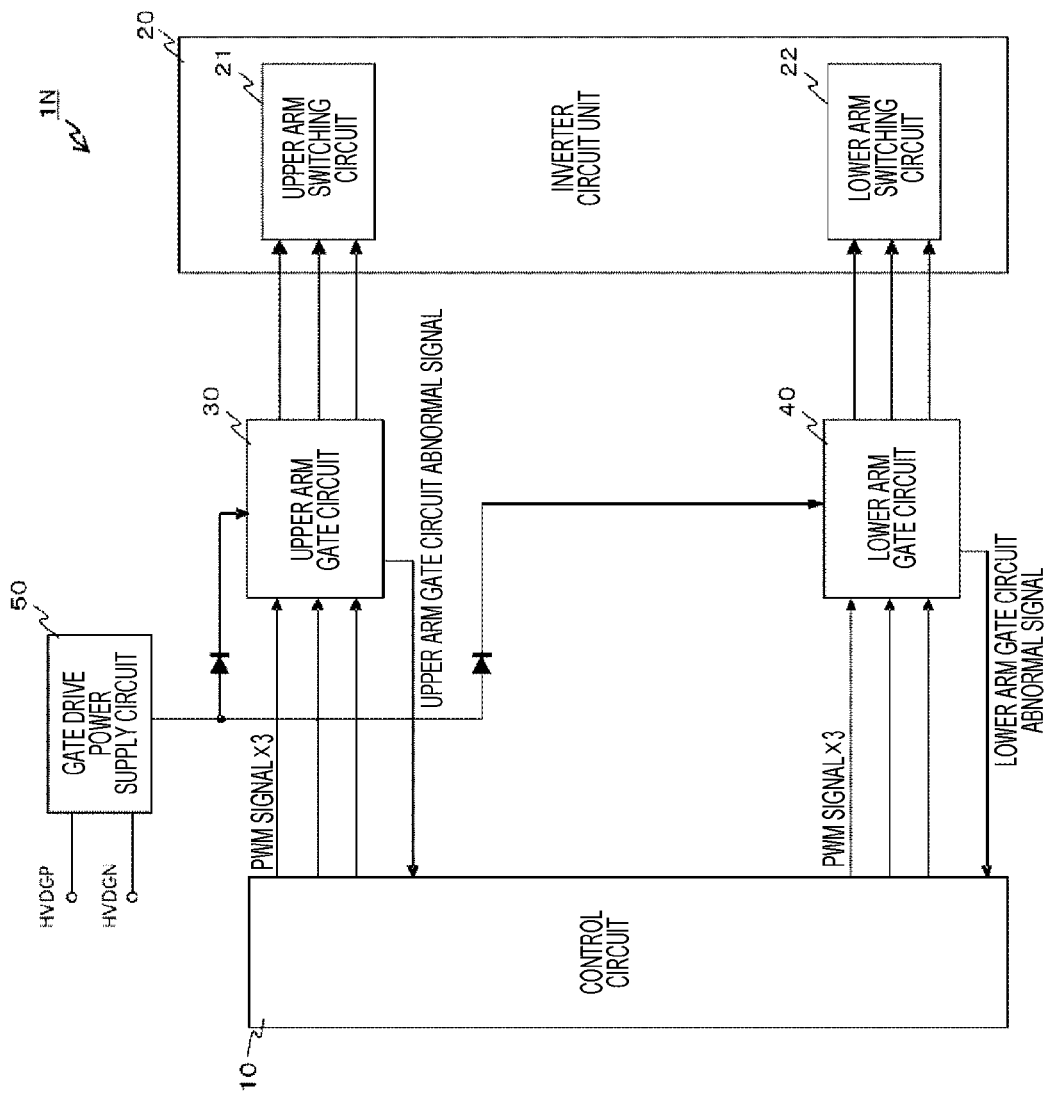
FIG. 4 is a diagram illustrating a configuration of a power conversion device according to a comparative example of the present invention.

Here, a power conversion device having no backup function of the gate drive powers will be described as a comparative example of the present invention. FIG. 4 is a diagram illustrating a configuration of the power conversion device according to the comparative example of the present invention. A power conversion device 1N illustrated in FIG. 4 has the same configuration as that of the power conversion device 1 illustrated in FIG. 1 except that the power conversion device 1N does not include the low-voltage abnormality detection circuit 60 and the backup power supply circuit 70.

Since the power conversion device 1N does not include the low-voltage abnormality detection circuit 60 and the backup power supply circuit 70, when the failure occurs in the gate drive power supply circuit 50, both the voltages of the gate drive powers applied to the upper arm gate circuit 30 and the lower arm gate circuit 40 from the gate drive power supply circuit 50 continue to decrease. As a result, the upper arm gate circuit abnormal signal and the lower arm gate circuit abnormal signal are output from the upper arm gate circuit 30 and the lower arm gate circuit 40 to the control circuit 10, respectively. In this case, the control circuit 10 outputs the PWM signals to the upper arm gate circuit 30 so as to turn off all the switching elements of the upper arm switching circuit 21, and also outputs the PWM signals to the lower arm gate circuit 40 so as to turn off all the switching elements of the lower arm switching circuit 22.

As described above, when all the switching elements in the upper arm switching circuit 21 and the lower arm switching circuit 22 are turned off, an electromotive force generated by the rotation of the motor is applied to the switching elements. Therefore, in a state in which the rotation speed of the motor is high, the electromotive force of the motor exceeds a withstand voltage of the switching element, and the switching element may be broken. There are also problems that a regenerative current generated by the electromotive force of the motor flows into the high-voltage battery and a regenerative torque is generated. In the power conversion device 1N, since the backup gate drive power cannot be supplied to the lower arm gate circuit 40, these problems cannot be avoided.

As described above, in the power conversion device 1N according to the comparative example, when the failure occurs in the gate drive power supply circuit 50, both the upper arm gate circuit 30 and the lower arm gate circuit 40 are turned off. Thus, one of the upper arm switching circuit 21 and the lower arm switching circuit 22 cannot enter a three-phase short-circuited state in which all the switching elements constituting the switching circuit are turned on, and it is difficult to shift the motor to a safe state.

Meanwhile, in the power conversion device 1 according to the embodiment of the present invention, when the failure occurs in the gate drive power supply circuit 50, the backup gate drive power is supplied from the backup power supply circuit 70 to the lower arm gate circuit 40, and the operation of the arm gate circuit 40 is continued. Therefore, in the inverter circuit unit 20, the lower arm switching circuit is in the short-circuited state by turning on all the switching elements of the lower arm switching circuit 22 in response to the gate signal from the lower arm gate circuit 40, and the motor can be shifted to the safe state.

The embodiment of the present invention described above may be modified as follows.

First Modification Example

Figure 5:
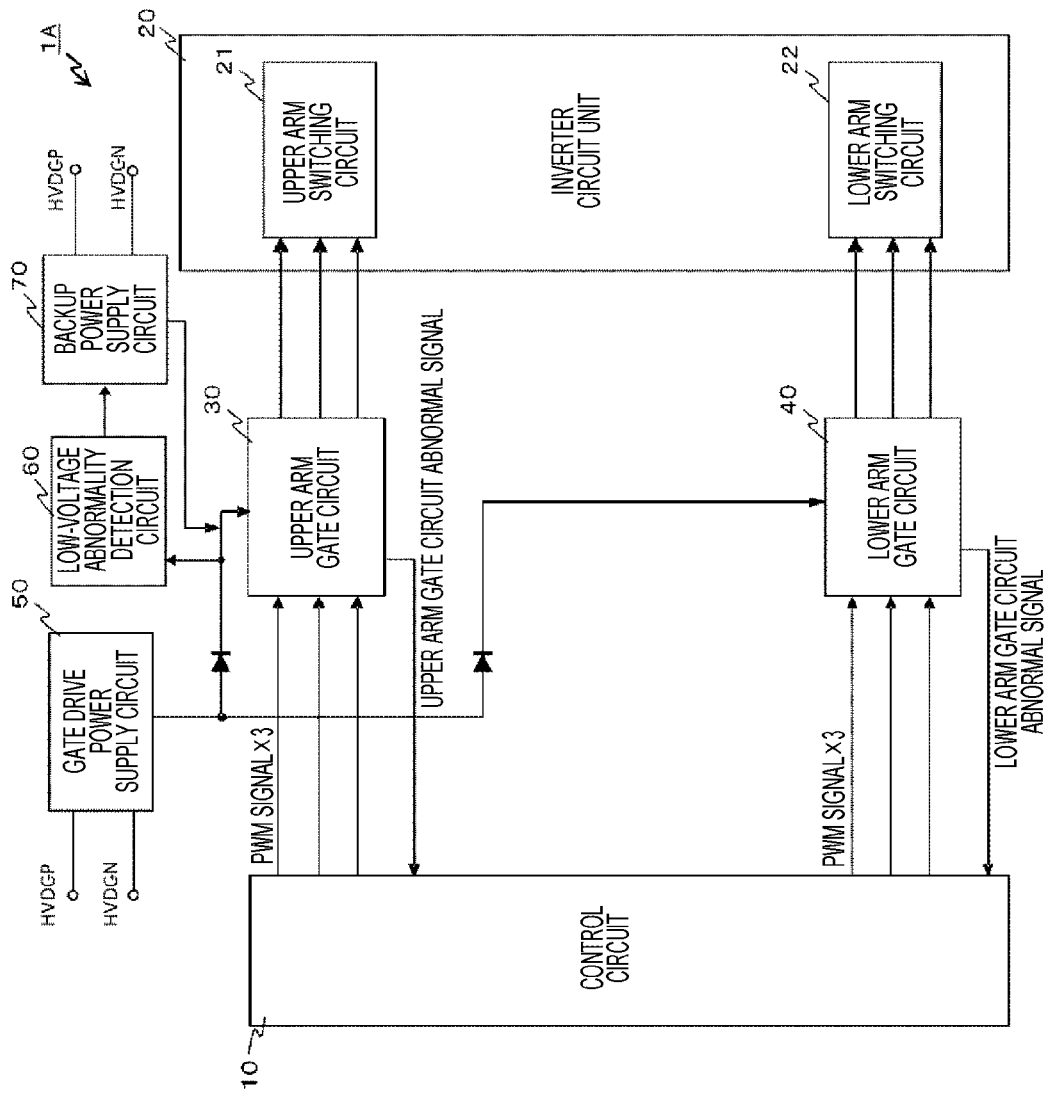
FIG. 5 is a diagram illustrating a configuration of a power conversion device according to a first modification example of the present invention.

FIG. 5 is a diagram illustrating a configuration of a power conversion device according to a first modification example of the present invention. In a power conversion device 1A illustrated in FIG. 5, the low-voltage abnormality detection circuit 60 and the backup power supply circuit 70 are connected to the upper arm gate circuit 30. Therefore, when the failure occurs in the gate drive power supply circuit 50 and the voltage of the gate drive power applied from the gate drive power supply circuit 50 to the upper arm gate circuit 30 decreases to reach the low-voltage abnormality detection voltage range, the backup gate drive power is supplied to the upper arm gate circuit 30 instead of the gate drive power supply circuit 50. Accordingly, in the inverter circuit unit 20, the upper arm switching circuit is in the short-circuited state by turning on all the switching elements of the upper arm switching circuit 21 in response to the gate signal from the upper arm gate circuit 30, and the motor can be shifted to the safe state. Other points are the same as those of the power conversion device 1 described in the first embodiment.

Second Modification Example

Figure 6:
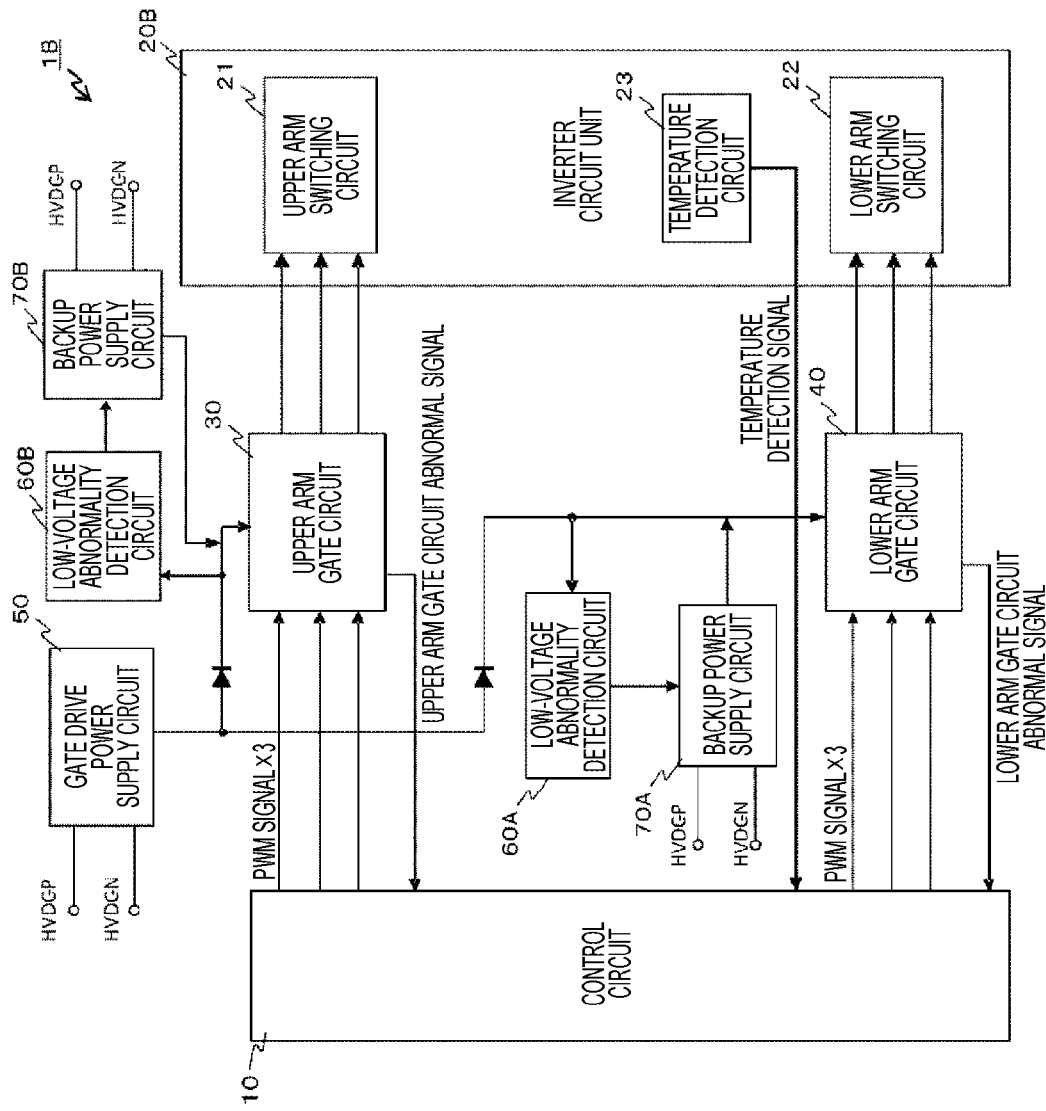
FIG. 6 is a diagram illustrating a configuration of a power conversion device according to a second modification example of the present invention.

FIG. 6 is a diagram illustrating a configuration of a power conversion device according to a second modification example of the present invention. In a power conversion device 1B illustrated in FIG. 6, a low-voltage abnormality detection circuit 60A and a backup power supply circuit 70A are connected to the lower arm gate circuit 40, and a low-voltage abnormality detection circuit 60B and a backup power supply circuit 70B are connected to the upper arm gate circuit 30. The low-voltage abnormality detection circuits 60A and 60B are the same as the low-voltage abnormality detection circuit 60 described in the first embodiment, and the backup power supply circuits 70A and 70B are the same as the backup power supply circuit 70 described in the first embodiment. Therefore, when the failure occurs in the gate drive power supply circuit 50 and the voltage of the gate drive power output from the gate drive power supply circuit 50 decreases to reach the low-voltage abnormality detection voltage range, the backup gate drive powers are supplied to the upper arm gate circuit 30 and the lower arm gate circuit 40 instead of the gate drive power supply circuit 50. Accordingly, in an inverter circuit unit 20B, the motor can be shifted to the safe state by turning on all the switching of any one switching circuit of the upper arm switching circuit 21 and the lower arm switching circuit 22 to cause the one thereof to be in the short-circuited state and turning off all the switching elements of the other switching circuit to cause the other switching circuit to be in the opened state in response to the gate signal from the upper arm gate circuit 30 or the lower arm gate circuit 40.

In the power conversion device 1B of FIG. 6, the inverter circuit unit 20B has a temperature detection circuit 23. The temperature detection circuit 23 detects a temperature of each switching element of the upper arm switching circuit 21 and the lower arm switching circuit 22, and outputs a temperature detection signal corresponding to the detection result to the control circuit 10. The control circuit 10 switches the switching circuit to be driven in the short-circuited state from one switching circuit of the upper arm switching circuit 21 and the lower arm switching circuit 22 to the other switching circuit based on the temperature detection signal input from the temperature detection circuit 23. That is, when the temperature of any one switching element of the switching circuit being driven in the short-circuited state is equal to or higher than a predetermined temperature, the control circuit 10 determines that this switching element is in an over-temperature state, and switches the switching circuit to be driven in the short-circuited state from one switching circuit to the other switching circuit. Other points are the same as those of the power conversion device 1 described in the first embodiment.

Third Modification Example

Figure 7:
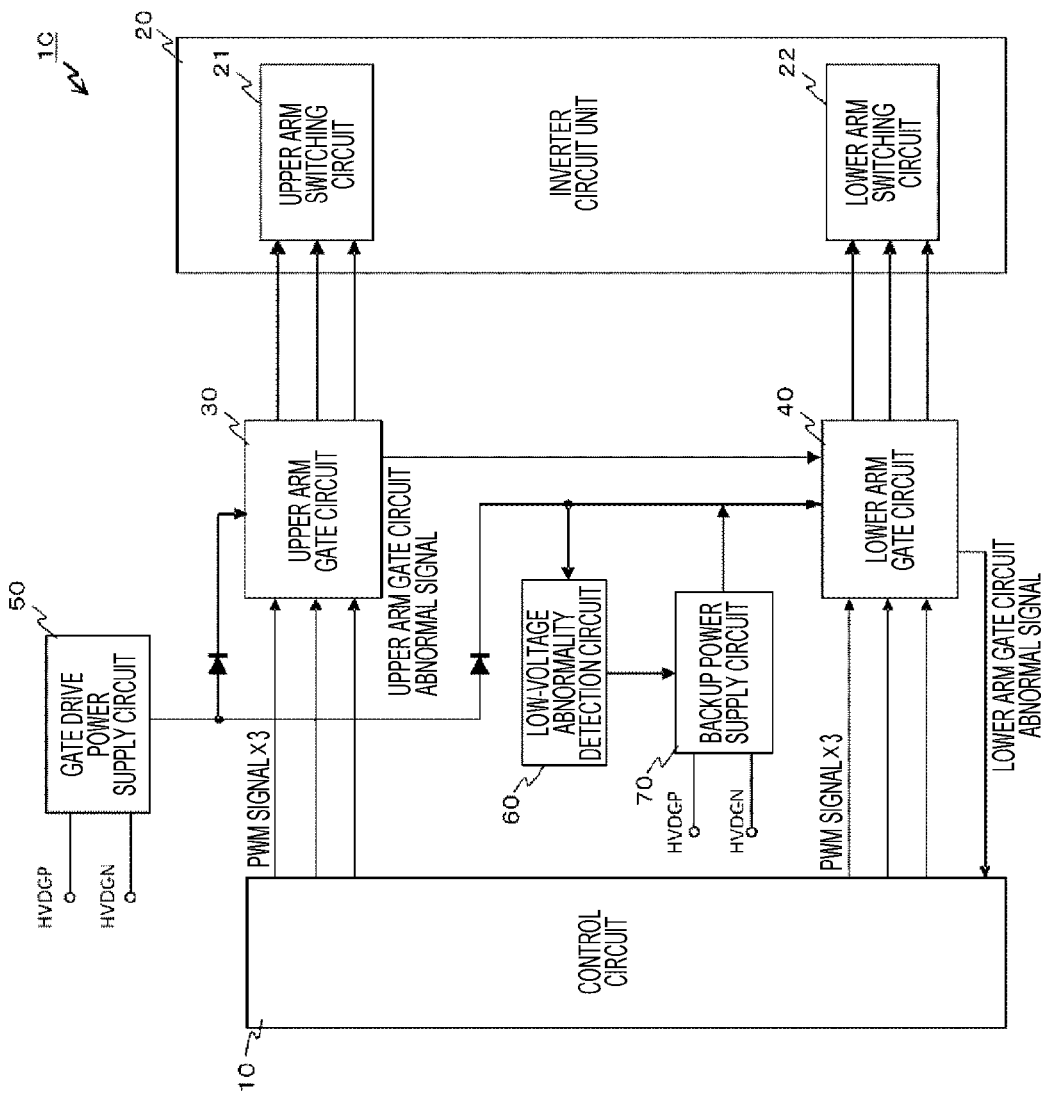
FIG. 7 is a diagram illustrating a configuration of a power conversion device according to a third modification example of the present invention.

FIG. 7 is a diagram illustrating a configuration of a power conversion device according to a third modification example of the present invention. In a power conversion device 1C illustrated in FIG. 7, the upper arm gate circuit abnormal signal output from the upper arm gate circuit 30 is input to the lower arm gate circuit 40 instead of the control circuit 10. When the upper arm gate circuit abnormal signal is input from the upper arm gate circuit 30, the lower arm gate circuit 40 causes the lower arm switching circuit 22 to be in the short-circuited state in which all the switching elements thereof are turned on. Accordingly, the motor can be shifted to the safe state. Other points are the same as those of the power conversion device 1 described in the first embodiment.

In FIG. 7, the low-voltage abnormality detection circuit 60 and the backup power supply circuit 70 are connected to the lower arm gate circuit 40, and the upper arm gate circuit abnormal signal output from the upper arm gate circuit 30 is input to the lower arm gate circuit 40. However, the same operation can be performed even though the upper arm gate circuit 30 and the lower arm gate circuit 40 are exchanged. That is, when the low-voltage abnormality detection circuit 60 and the backup power supply circuit 70 are connected to the upper arm gate circuit 30 as in the first modification example, the lower arm gate circuit abnormal signal output from the lower arm gate circuit 40 may be input to the upper arm gate circuit 30. In this case, when the lower arm gate circuit abnormal signal is input from the lower arm gate circuit 40, the upper arm gate circuit 30 causes the upper arm switching circuit 21 to be in the short-circuited state in which all the switching elements thereof are turned on. Even in this case, the motor can be shifted to the safe state.

Fourth Modification Example

Figure 8:
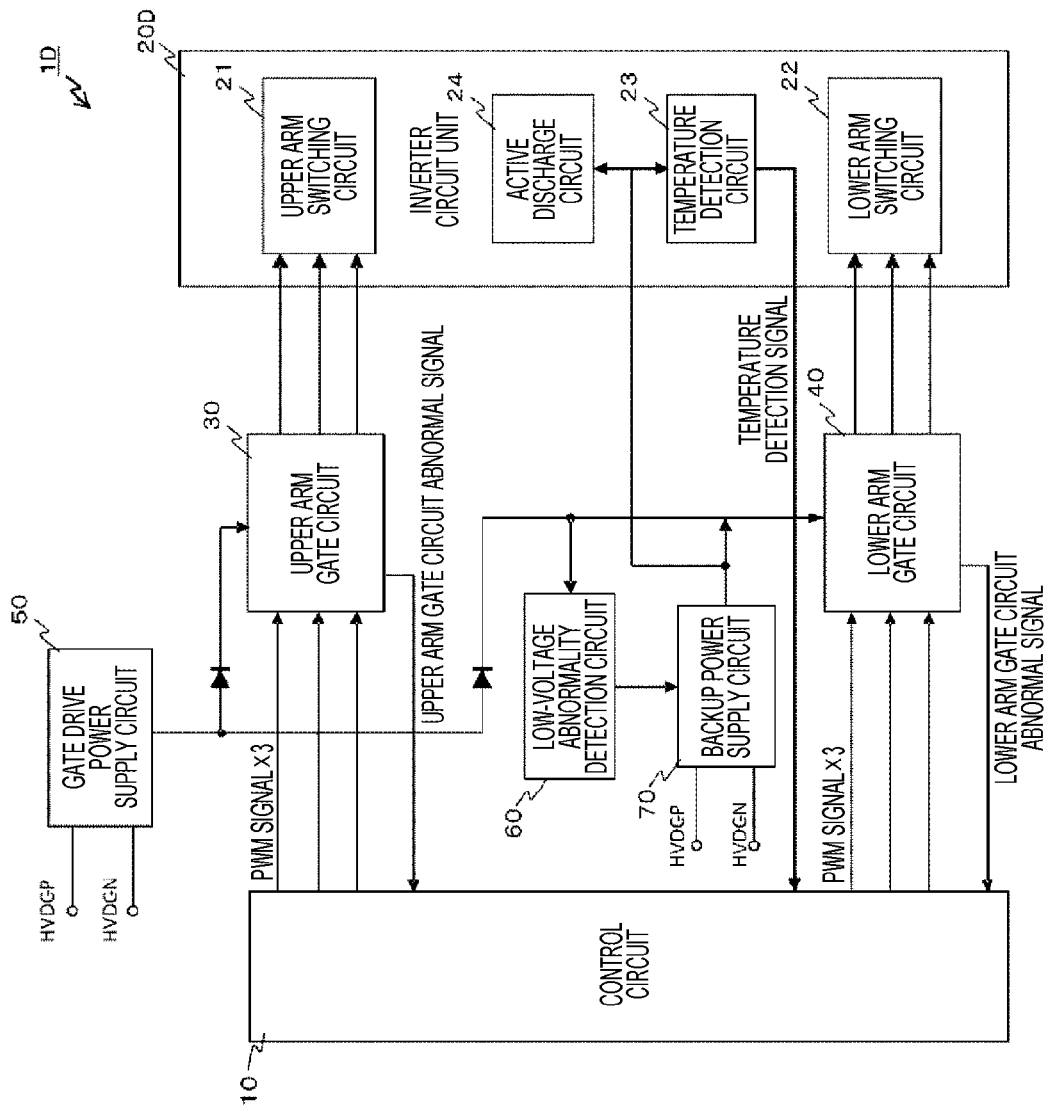
FIG. 8 is a diagram illustrating a configuration of a power conversion device according to a fourth modification example of the present invention.

FIG. 8 is a diagram illustrating a configuration of a power conversion device according to a fourth modification example of the present invention. In a power conversion device 1D illustrated in FIG. 8, the output of the backup power supply circuit 70 is connected not only to the lower arm gate circuit 40 but also to the temperature detection circuit 23 and an active discharge circuit 24 included in an inverter circuit unit 20D. The temperature detection circuit 23 detects a temperature of each switching element of the upper arm switching circuit 21 and the lower arm switching circuit 22, and outputs a temperature detection signal corresponding to the detection result to the control circuit 10. The active discharge circuit 24 causes the inverter circuit unit 20D to rapidly discharge electric charges accumulated in a smoothing capacitor (not illustrated) when the power is turned off, in order to prevent an accidental electric shock of an operator or a driver. Accordingly, the safety when the motor stops is further improved. Other points are the same as those of the power conversion device 1 described in the first embodiment.

In FIG. 8, the low-voltage abnormality detection circuit 60 and the backup power supply circuit 70 are connected to the lower arm gate circuit 40. However, the same operation can be performed even though the upper arm gate circuit 30 and the lower arm gate circuit 40 are exchanged. That is, when the low-voltage abnormality detection circuit 60 and the backup power supply circuit 70 are connected to the upper arm gate circuit 30 as in the first modification example, the backup gate drive power may be supplied to the temperature detection circuit 23 and the active discharge circuit 24 from the backup power supply circuit 70. When the low-voltage abnormality detection circuit 60A and the backup power supply circuit 70A are connected to the lower arm gate circuit 40 and the low-voltage abnormality detection circuit 60B and the backup power supply circuit 70B are connected to the upper arm gate circuit 30 as in the second modification example, the backup gate drive power may be supplied to the temperature detection circuit 23 and the active discharge circuit 24 from at least one of the backup power supply circuits 70A and 70B. Alternatively, in the power conversion device 1B according to the second modification example illustrated in FIG. 6, the backup gate drive power may be supplied to the temperature detection circuit 23 from at least one of the backup power supply circuits 70A and 70B. Even in this case, the safety when the motor stops can be further improved.

Fifth Modification Example

Figure 9:
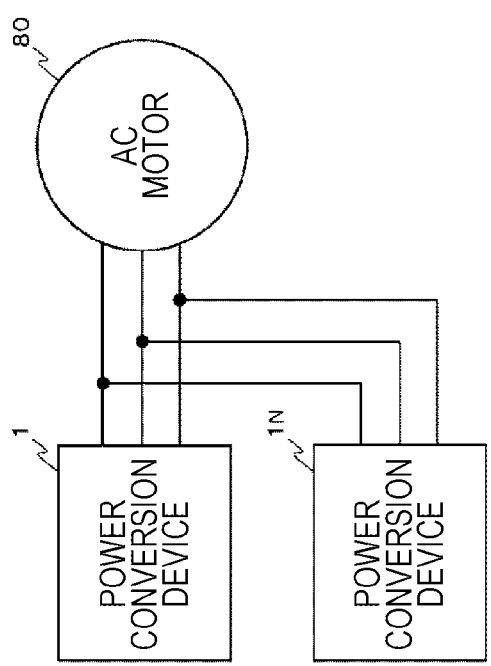
FIG. 9 is a diagram illustrating a configuration of a power conversion device according to a fifth modification example of the present invention.

FIG. 9 is a diagram illustrating a configuration of a power conversion device according to a fifth modification example of the present invention. In the power conversion device illustrated in FIG. 9, the power conversion device 1 described in the first embodiment and the power conversion device 1N described in the comparative example are connected to a common AC motor 80. That is, the inverter circuit unit 20 of the power conversion device 1 described with reference to FIG. 1 and the inverter circuit unit 20 of the power conversion device 1N described with reference to FIG. 4 are connected to the common AC motor 80, and supply AC powers to the AC motor 80.

When the failure occurs in the gate drive power supply circuits 50 in the power conversion devices 1 and 1N and the voltage of the gate drive power applied to the lower arm gate circuit 40 from the gate drive power supply circuit 50 decreases, the backup power supply circuit 70 of the power conversion device 1 supplies the backup gate drive power to the lower arm gate circuit 40 of the power conversion device 1. Accordingly, the lower arm switching circuit 22 can be caused in the short-circuited state by turning on all the switching elements thereof. Meanwhile, since the power conversion device 1N does not have the backup power supply circuit 70, the backup gate drive power is not supplied to the lower arm gate circuit 40 of the power conversion device 1N, and the lower arm switching circuit 22 cannot be caused in the short-circuit state. However, since the power conversion device 1 and the power conversion device 1N are connected to the same AC motor 80, the lower arm switching circuit 22 of the power conversion device 1 is caused in the short-circuited state as described above, and thus, the aforementioned problem is not caused in the power conversion device 1N.

Although the power conversion device 1 and the power conversion device 1N are connected to the common AC motor 80 in FIG. 9, the power conversion device 1 may be replaced with the power conversion devices 1A to 1D described in the modification examples. Three or more power conversion devices may be connected to one AC motor 80. Any configuration can be adopted as long as at least one of the plurality of power conversion devices commonly connected to the AC motor 80 is the power conversion device described in the aforementioned embodiment and the modification examples.

According to the above-described embodiment of the present invention, the following effects can be obtained.

(1) A power conversion device 1, 1A, or 1D includes an inverter circuit unit 20 that includes an upper arm switching circuit 21 and a lower arm switching circuit 22 each having a plurality of switching elements, an upper arm gate circuit 30 that outputs a gate signal to the upper arm switching circuit 21, a lower arm gate circuit 40 that outputs a gate signal to the lower arm switching circuit 22, a gate drive power supply circuit 50 that supplies gate drive powers to the upper arm gate circuit 30 and the lower arm gate circuit 40, and a backup power supply circuit 70 that supplies the gate drive power to at least one of the upper arm gate circuit 30 and the lower arm gate circuit 40 instead of the gate drive power supply circuit 50. The gate drive power supply circuit 50 is capable of supplying the gate drive power within a predetermined normal voltage range 110. The backup power supply circuit 70 supplies the gate drive power to at least one of the upper arm gate circuit 30 and the lower arm gate circuit 40 when a voltage of the gate drive power applied to at least one of the upper arm gate circuit 30 and the lower arm gate circuit 40 from the gate drive power supply circuit 50 falls below the normal voltage range 110. At least one of the upper arm gate circuit 30 and the lower arm gate circuit 40 drives each of the upper arm switching circuit 21 and the lower arm switching circuit 22 by causing one switching circuit of the upper arm switching circuit 21 or the lower arm switching circuit 22 to be in a short-circuited state in which all the switching elements are turned on and causing the other switching circuit to be in an opened state in which all the switching elements are turned off when the gate drive power is supplied from the backup power supply circuit 70. With this configuration, availability when the gate drive power is lost can be improved.

(2) The power conversion device further includes a low-voltage abnormality detection circuit 60 that detects a low-voltage abnormality and operates the backup power supply circuit 70 when the voltage of the gate drive power applied to at least one of the upper arm gate circuit 30 and the lower arm gate circuit 40 from the gate drive power supply circuit 50 falls in a predetermined low-voltage abnormality detection voltage range 111 lower than the normal voltage range 110. With this configuration, the backup gate drive power can be supplied from the backup power supply circuit 70 at an appropriate timing.

(3) At least one of the upper arm gate circuit 30 and the lower arm gate circuit 40 drives each of the upper arm switching circuit 21 and the lower arm switching circuit 22 in the opened state when the voltage of the gate drive power supplied from the gate drive power supply circuit 50 is lower than a predetermined operation stop voltage Vth1. The backup power supply circuit 70 supplies the gate drive power to at least one of the upper arm gate circuit 30 and the lower arm gate circuit 40 when the voltage of the gate drive power applied to at least one of the upper arm gate circuit 30 and the lower arm gate circuit 40 from the gate drive power supply circuit 50 falls below the normal voltage range 110 and is higher than the operation stop voltage Vth1. With this configuration, it is possible to supply the backup gate drive power before the upper arm gate circuit 30 and the lower arm gate circuit 40 enter the low-voltage abnormal state in which these gate circuits cannot normally operate.

(4) In the power conversion device 1, the backup power supply circuit 70 supplies the gate drive power to the lower arm gate circuit 40 when the voltage of the gate drive power applied to the lower arm gate circuit 40 from the gate drive power supply circuit 50 falls below the normal voltage range 110. With this configuration, it is possible to reduce power consumption, reduce a circuit scale, and reduce cost when availability when the gate drive power is lost is improved.

(5) In the power conversion device 1A, the backup power supply circuit 70 supplies the gate drive power to the upper arm gate circuit 30 when the voltage of the gate drive power applied to the upper arm gate circuit 30 from the gate drive power supply circuit 50 falls below the normal voltage range 110. With this configuration, when the availability when the gate drive power supply is lost is improved, it is possible to reduce the power consumption, reduce the circuit scale, and reduce the cost as described above.

(6) In the power conversion device 1B, the backup power supply circuit 70A or 70B supplies the gate drive power to the upper arm gate circuit 30 when the voltage of the gate drive power applied to the upper arm gate circuit 30 from the gate drive power supply circuit 50 falls below the normal voltage range 110, and supplies the gate drive power to the lower arm gate circuit 40 when the voltage of the gate drive power applied to the lower arm gate circuit 40 from the gate drive power supply circuit 50 falls below the normal voltage range 110. With this configuration, it is possible to further improve the availability when the gate drive power is lost.

(7) In the power conversion device 1B, the inverter circuit unit 20B includes a temperature detection circuit 23 that detects a temperature of each switching element of the upper arm switching circuit 21 and the lower arm switching circuit 22. When the one switching circuit of the upper arm switching circuit 21 or the lower arm switching circuit 22 is driven in the short-circuited state and the temperature of the switching element detected by the temperature detection circuit 23 is equal to or higher than a predetermined temperature, the switching circuit to be driven in the short-circuited state is switched from the one switching circuit to the other switching circuit, and the switching circuit to be driven in the opened state is switched from the other switching circuit to the one switching circuit. With this configuration, even when the switching element in one of the switching circuits is overheated, the short-circuited state can be continued in one of the switching circuits.

(8) In the power conversion device 1C, the one gate circuit of the upper arm gate circuit 30 or the lower arm gate circuit 40 outputs a predetermined abnormal signal to the other gate circuit when the voltage of the gate drive power supplied from the gate drive power supply circuit 50 is lower than a predetermined operation stop voltage Vth1. The other gate circuit drives the upper arm switching circuit 21 or the lower arm switching circuit 22 in the short-circuited state when the abnormal signal is input from the one gate circuit. With this configuration, even when the control circuit 10 cannot normally operate, since the upper arm switching circuit 21 or the lower arm switching circuit 22 can be short-circuited, the availability when the gate drive power is lost can be further improved.

(9) In the power conversion device 1D, the inverter circuit unit 20D includes a temperature detection circuit 23 that detects a temperature of each switching element of the upper arm switching circuit 21 and the lower arm switching circuit 22, and an active discharge circuit 14 that discharges electric charges accumulated in the inverter circuit unit 20D. The backup power supply circuit 70 supplies the backup gate drive power to at least one of the temperature detection circuit 23 and the active discharge circuit 24 when the voltage of the gate drive power applied to at least one of the upper arm gate circuit 30 and the lower arm gate circuit 40 form the gate drive power supply circuit 50 falls below the normal voltage range 110 of the gate drive power. Alternatively, in the power conversion device 1B, the backup power supply circuit 70A or 70B may the backup power to the temperature detection circuit 23 when the voltage of the gate drive power applied to at least one of the upper arm gate circuit 30 and the lower arm gate circuit 40 form the gate drive power supply circuit 50 falls below the normal voltage range 110. With this configuration, the safety when the motor stops can be further improved.

(10) In addition to the power conversion device 1, the power conversion device described in the fifth modification example further includes the power conversion device 1N that includes an inverter circuit unit 20 that includes an upper arm switching circuit 21 and a lower arm switching circuit 22 each having a plurality of switching elements, an upper arm gate circuit 30 that outputs a gate signal to the upper arm switching circuit 21, and a lower arm gate circuit 40 that outputs a gate signal to the lower arm switching circuit 22. The inverter circuit unit 20 of the power conversion device 1 and the inverter circuit unit 20 of the power conversion device 1N are connected to a common AC motor 80. The backup power supply circuit 70 of the power conversion device 1 does not supply the gate drive power to any of the upper arm gate circuit 30 and the lower arm gate circuit 40 of the power conversion device 1N. With this configuration, in the power conversion device configured to drive the motor by using a plurality of inverters, the availability when the gate drive power is lost can be improved at low cost.

The above-described embodiment and various modification examples are merely examples, and the present invention is not limited to these contents as long as the features of the invention are not impaired. Although various embodiments and modification examples have been described above, the present invention is not limited to these contents. Other embodiments considered within the scope of the technical idea of the present invention are also included within the scope of the present invention.

REFERENCE SIGNS LIST 1, 1A, 1B, 1C, 1D, 1N power conversion device
10 control circuit
20, 20B, 20D inverter circuit unit
21 upper arm switching circuit
22 lower arm switching circuit
23 temperature detection circuit
24 active discharge circuit
30 upper arm gate circuit
40 lower arm gate circuit
50 gate drive power supply circuit
60, 60A, 60B low-voltage abnormality detection circuit
70, 70A, 70B backup power supply circuit

The invention claimed is:

1. A power conversion device comprising:
an inverter circuit unit that includes an upper arm switching circuit and a lower arm switching circuit each having a plurality of switching elements;
an upper arm gate circuit configured to output a gate signal to the upper arm switching circuit;
a lower arm gate circuit configured to output a gate signal to the lower arm switching circuit;
a gate drive power supply circuit configured to supply power to the upper arm gate circuit and the lower arm gate circuit; and
a backup power supply circuit configured to supply the power to at least one of the upper arm gate circuit or the lower arm gate circuit instead of the gate drive power supply circuit,
wherein
the gate drive power supply circuit is configured to supply the power within a predetermined normal voltage range,
the backup power supply circuit is configured to supply the power to at least one of the upper arm gate circuit or the lower arm gate circuit when a voltage of the power applied to at least one of the upper arm gate circuit or the lower arm gate circuit from the gate drive power supply circuit falls below the normal voltage range, and
at least one of the upper arm gate circuit or the lower arm gate circuit is configured to drive each of the upper arm switching circuit and the lower arm switching circuit by causing one switching circuit of the upper arm switching circuit or the lower arm switching circuit to be in a short-circuited state in which all the switching elements are turned on and causing the other switching circuit to be in an opened state in which all the switching elements are turned off when the power is supplied from the backup power supply circuit; and
a low-voltage abnormality detection circuit configured to detect the voltage of the power applied to at least one of the upper arm gate circuit or the lower arm gate circuit from the gate drive power supply circuit, detect a low-voltage abnormality and operate the backup power supply circuit when the voltage of the power applied to at least one of the upper arm gate circuit or the lower arm gate circuit from the gate drive power supply circuit falls within a predetermined low-voltage abnormality detection voltage range lower than the normal voltage range.

2. The power conversion device according to claim 1, wherein
at least one of the upper arm gate circuit or the lower arm gate circuit drives each of the upper arm switching circuit and the lower arm switching circuit in the opened state when the voltage of the power supplied from the gate drive power supply circuit is lower than a predetermined operation stop voltage, and
the backup power supply circuit is configured to supply the power to at least one of the upper arm gate circuit or the lower arm gate circuit when the voltage of the power applied to at least one of the upper arm gate circuit or the lower arm gate circuit from the gate drive power supply circuit falls below the normal voltage range and is higher than the operation stop voltage.

3. The power conversion device according to claim 1, wherein
the backup power supply circuit supplies the power to the lower arm gate circuit when the voltage of the power applied to the lower arm gate circuit from the gate drive power supply circuit falls below the normal voltage range.

4. The power conversion device according to claim 1, wherein
the backup power supply circuit supplies the power to the upper arm gate circuit when the voltage of the power applied to the upper arm gate circuit from the gate drive power supply circuit falls below the normal voltage range.

5. The power conversion device according to claim 1, wherein
the backup power supply circuit supplies the power to the upper arm gate circuit when the voltage of the power applied to the upper arm gate circuit from the gate drive power supply circuit falls below the normal voltage range, and supplies the power to the lower arm gate circuit when the voltage of the power applied to the lower arm gate circuit from the gate drive power supply circuit falls below the normal voltage range.

6. The power conversion device according to claim 5, wherein
the inverter circuit unit includes a temperature detection circuit configured to detect a temperature of each switching element of the upper arm switching circuit and the lower arm switching circuit, and
when the one switching circuit is driven in the short-circuited state and the temperature of the switching element detected by the temperature detection circuit is equal to or higher than a predetermined temperature, the switching circuit to be driven in the short-circuited state is switched from the one switching circuit to the other switching circuit, and the switching circuit to be driven in the opened state is switched from the other switching circuit to the one switching circuit.

7. The power conversion device according to claim 6, wherein
the backup power supply circuit supplies the power to the temperature detection circuit when the voltage of the power applied to at least one of the upper arm gate circuit or the lower arm gate circuit form the gate drive power supply circuit falls below the normal voltage range.

8. The power conversion device according to claim 1, wherein
the one gate circuit of the upper arm gate circuit or the lower arm gate circuit outputs a predetermined abnormal signal to the other gate circuit when the voltage of the power supplied from the gate drive power supply circuit is lower than a predetermined operation stop voltage, and
the other gate circuit drives the upper arm switching circuit or the lower arm switching circuit in the short-circuited state when the abnormal signal is input from the one gate circuit.

9. A power conversion device comprising:
an inverter circuit unit that includes an upper arm switching circuit and a lower arm switching circuit each having a plurality of switching elements;
an upper arm gate circuit configured to output a gate signal to the upper arm switching circuit;
a lower arm gate circuit configured to output a gate signal to the lower arm switching circuit;
a gate drive power supply circuit configured to supply power to the upper arm gate circuit and the lower arm gate circuit; and
a backup power supply circuit configured to supply the power to at least one of the upper arm gate circuit or the lower arm gate circuit instead of the gate drive power supply circuit,
wherein
the gate drive power supply circuit is configured to supply the power within a predetermined normal voltage range,
the backup power supply circuit is configured to supply the power to at least one of the upper arm gate circuit or the lower arm gate circuit when a voltage of the power applied to at least one of the upper arm gate circuit or the lower arm gate circuit from the gate drive power supply circuit falls below the normal voltage range, and
at least one of the upper arm gate circuit or the lower arm gate circuit is configured to drive each of the upper arm switching circuit and the lower arm switching circuit by causing one switching circuit of the upper arm switching circuit or the lower arm switching circuit to be in a short-circuited state in which all the switching elements are turned on and causing the other switching circuit to be in an opened state in which all the switching elements are turned off when the power is supplied from the backup power supply circuit,
wherein the inverter circuit unit includes a temperature detection circuit configured to detect a temperature of each switching element of the upper arm switching circuit and the lower arm switching circuit, and an active discharge circuit configured to discharge electric charges accumulated in the inverter circuit unit, and
the backup power supply circuit is configured to supply the power to at least one of the temperature detection circuit or the active discharge circuit when the voltage of the power applied to at least one of the upper arm gate circuit or the lower arm gate circuit from the gate drive power supply circuit falls below the normal voltage range.

10. A power conversion device comprising:
an inverter circuit unit that includes an upper arm switching circuit and a lower arm switching circuit each having a plurality of switching elements;
an upper arm gate circuit configured to output a gate signal to the upper arm switching circuit;
a lower arm gate circuit configured to output a gate signal to the lower arm switching circuit;
a gate drive power supply circuit configured to supply power to the upper arm gate circuit and the lower arm gate circuit; and
a backup power supply circuit configured to supply the power to at least one of the upper arm gate circuit or the lower arm gate circuit instead of the gate drive power supply circuit,
wherein
the gate drive power supply circuit is configured to supply the power within a predetermined normal voltage range,
the backup power supply circuit is configured to supply the power to at least one of the upper arm gate circuit or the lower arm gate circuit when a voltage of the power applied to at least one of the upper arm gate circuit or the lower arm gate circuit from the gate drive power supply circuit falls below the normal voltage range, and
at least one of the upper arm gate circuit or the lower arm gate circuit is configured to drive each of the upper arm switching circuit and the lower arm switching circuit by causing one switching circuit of the upper arm switching circuit or the lower arm switching circuit to be in a short-circuited state in which all the switching elements are turned on and causing the other switching circuit to be in an opened state in which all the switching elements are turned off when the power is supplied from the backup power supply circuit,
the power conversion device further comprising:
a second inverter circuit unit that includes a second upper arm switching circuit and a second lower arm switching circuit each having a plurality of switching elements;
a second upper arm gate circuit configured to output a gate signal to the second upper arm switching circuit; and
a second lower arm gate circuit configured to output a gate signal to the second lower arm switching circuit,
wherein
the inverter circuit unit and the second inverter circuit unit are connected to a common motor, and the backup power supply circuit does not supply the power to any of the second upper arm gate circuit and the second lower arm gate circuit.

* * * * *